United States Patent [19]

Beaman

[11] Patent Number: 4,998,885

[45] Date of Patent: Mar. 12, 1991

[54] ELASTOMERIC AREA ARRAY INTERPOSER

[75] Inventor: Brian S. Beaman, Hyde Park, N.Y.

[73] Assignee: International Business Machines Corporation, Armonk, N.Y.

[21] Appl. No.: 427,548

[22] Filed: Oct. 27, 1989

[51] Int. Cl.$^5$ .............................................. H01R 9/09
[52] U.S. Cl. ........................................ 439/66; 439/591
[58] Field of Search .................. 439/65, 66, 74, 91, 439/591; 29/830, 860, 877

[56] References Cited

U.S. PATENT DOCUMENTS

| | | | |
|---|---|---|---|
| 3,795,037 | 3/1974 | Luttmer | 439/591 X |
| 4,118,092 | 10/1978 | Sado et al. | |
| 4,203,203 | 5/1980 | Gilissen et al. | 29/846 |
| 4,295,700 | 10/1981 | Sado | |
| 4,400,234 | 8/1983 | Berg | 156/634 |
| 4,408,814 | 10/1983 | Takashi et al. | |
| 4,509,099 | 4/1985 | Takamatsu et al. | 439/65 X |
| 4,520,562 | 6/1985 | Sado et al. | 29/878 |
| 4,793,814 | 12/1988 | Zifcak | 439/91 X |

FOREIGN PATENT DOCUMENTS 1003396 3/1983 U.S.S.R. .................. 439/66

Primary Examiner—Neil Abrams
Assistant Examiner—Khiem Nguyen
Attorney, Agent, or Firm—Blaney Harper; George E. Clark; Maurice H. Klitzman

[57] ABSTRACT

This invention provides an interposer for electrically connecting two substrates with high density interconnections. The interposer comprises an elastomeric material surrounding fine metal wires which extend through the elastomeric material. The elastomeric material provides mechanical support and electrical isolation for the wires which connect the two opposing surfaces of the interposer with mating substrates. One surface of the interposed has scribes cut into it which mechanically isolate the individual wires. This mechanical isolation between wires reduces the stress placed on the substrates from being connected when the interposer is compressed between the substrates. The support given individual wires by the elastomeric material is controlled, by adjusting the spacing and widths of the scribes, to provide uniform compression across the substrates. Reducing the differentials in compression across the substrates reduces the stress on the substrates and their connections, and therefore, maintains substrate reliability when the substrates are exposed to extended time periods under compression.

8 Claims, 8 Drawing Sheets

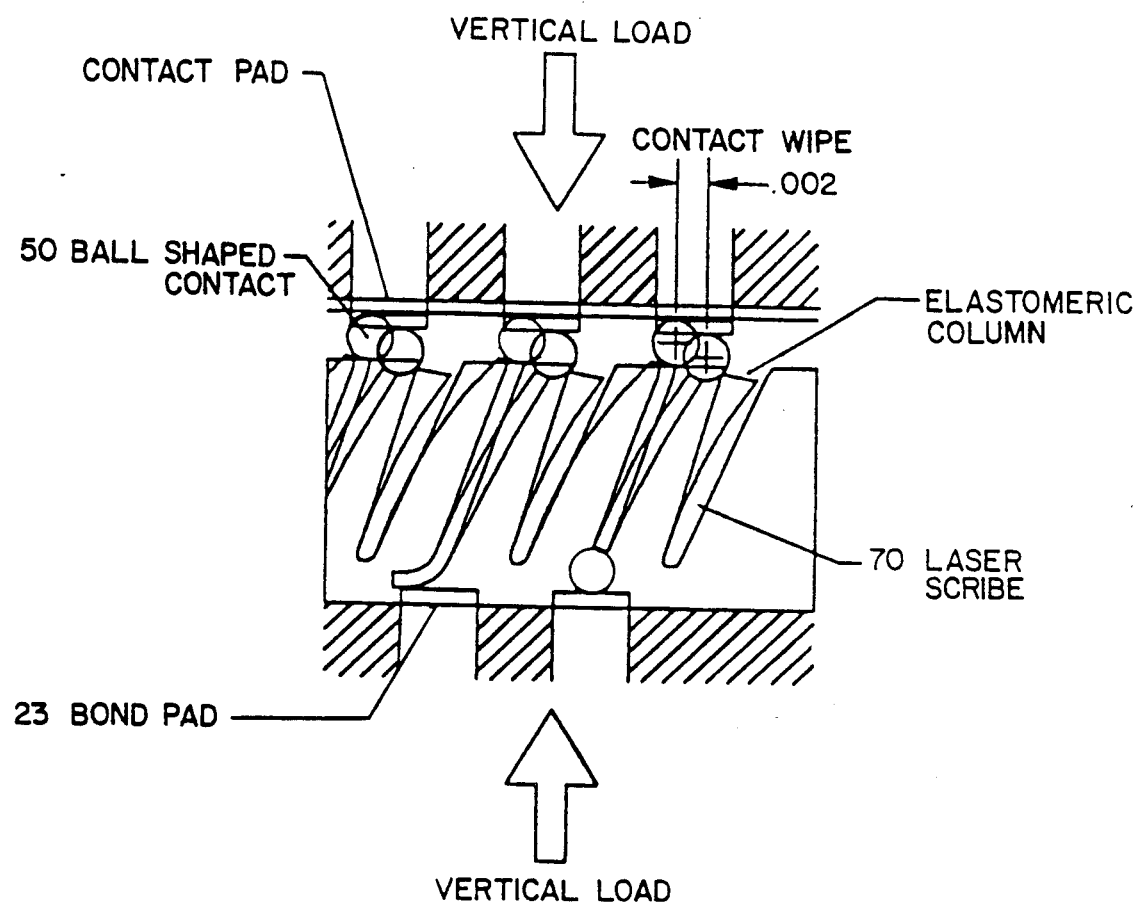

97 LOOP POST

FRONT VIEW   SIDE VIEW

STEP 1
BALL BOND

95 FEEDER   97 LOOP POST

STEP 2
FEED OUT WIRE
ENGAGE LOOP TOOL

STEP 3
FORM LOOP
WEDGE BOND

- GOLD WIRE
- BALL BOND
- WEDGE BOND
- CAPILLARY
- BOND PAD
- SUBSTRATE
- ROTARY WIPE LOOPING TOOL

STEP 4
SEPARATE WIRE
SLIP LOOP

ELASTOMERIC AREA ARRAY INTERPOSER

FIELD OF INVENTION

This invention relates to the field of electric connectors and more specifically to connectors for electronic circuits.

BACKGROUND OF THE INVENTION

The number of electronric circuits that can be manufactured per unit area of silicon or board space has increased dramatically in recent years. This increase in circuit density has produced a corresponding increase in the number of connections required between the various electronic circuits. Integrated circuit chips and boards require not only high density but high reliability connections to other integrated circuit chips and boards to facilitate the manufacture of more complex products. The higher circuit density mandates the higher connection reliability because the probability of the product failing increases with the rising number of circuit connections within that product. Therefore, in order to maintain the product reliability, the reliability of the individual connections must increase. In addition, the connections must maintain this reliability even though the connections are connected, separated, and reconnected several times during the manufacturing of the product. This connecting and reconnecting process is necessary to test the individual electronic circuit components before they are assembled into a final product.

The density, reliability, and testing requirements of electronic circuit connections have been met with a variety of interconnection techniques. One such technique is to wire bond the terminal connections of several electronic circuits together. This involves the mechanical and thermal compression of a soft metal wire, typically gold, from one circuit to another. Wire bonding does not lend itself to high density or reliability because the wires break and are mechanically difficult to handle as the wires get longer due to making connections to all but the peripheral terminal connections of the electronic circuits. Another technique used for circuit interconnection is to place a bump or ball of soft metal, such as gold or a gold composite, onto the terminal connection of the electronic circuit. The pattern of metal balls (corresponding to the pattern of terminal connections) match a predesigned pattern of terminal connections on another electronic circuit. The two patterns are joined and then heated so that the metal balls adhere to both circuits, thereby forming the connection. This technique enables high density interconnections because the number of connections is only limited by the space required to separate individual metal balls. However, the technique creates testing problems because the connections have to be heated to be disconnected, the balls must be reformed once disconnected, and the balls have to be reheated again when the circuits are reconnected during the test procedure. This is a very expensive procedure which also has a limit on the number of times the metal balls can be heated and reheated before the metal balls must be stripped off and new ones redeposited in their place. The expense and test requirements of this interconnection technique limits its usefulness.

In response to the problems encountered with the wire bonding and metal ball interconnection techniques, a variety of elastomer interconnection materials and techniques have been developed. Generally, the elastomer material is one in which current is conducted through the material by a plurality of conductive paths embedded within the elastomer material. The conductive paths are typically small diameter wires or small area columns of conductive material which are insulated from each other by the elastomer material. Individual wires or columns of conductive material are spaced closely with respect to each other and groups of the closely spaced conductive paths are arranged on a grid or other pattern to match the electrical circuit terminal connection pattern. A typical elastomeric interconnection technique involves placing the elastomeric material between two electronic circuits and compressing the material between the circuits. Once compressed, the electrical connections between the two circuits are established because the small spacing between individual conductive paths and the high number of paths used for a single contact assures contact is made to an electronic circuit connection terminal. The groups of conductive paths are arranged within the elastomeric material in array or other patterns which align to the pattern of connection terminals on the electronic circuit.

The elastomeric interconnection technique is especially useful in testing electronic circuits because circuits can be removed and replaced and the elastomeric interconnection material will expand and recompress without damaging either the electronic circuits or the material itself. This is a very inexpensive test method because the interconnection material may be reused and no additional processing is required to repair damaged circuits. However, a basic problem with this method of interconnecting electronic circuits is the reliability of the connections over a large array of interconnections. This is a problem because the elastomeric connector material has a resilience which is not uniform across a large area. The nonuniform resilience results in two problems. First, the elastomeric material places different mechanical strains on different parts of the electronic circuit in response to the compressive force holding the circuits together. Second, the differences in resiliency lead to electrical interconnections which have either high contact resistance or are open altogether.

The effects of nonuniform stress are especially evident when testing involves protracted time periods under extreme environmental conditions, as would be the case for burn-in testing. Therefore, many of the advantages associated with the elastomeric interconnection material, such as reliability and inexpense of non-damaged circuits, are nonexistent when large area connections are under compression for extended periods of time. Attempts to minimize these effects have typically centered around using bent or corrugated metal wires in the elastomeric material. The pre-bent wires compress in a more uniform manner and as such decrease nonuniform stress across the elastomeric material. However, because the wires are pre-bent, they are difficult to align with respect to each other in the elastomeric material. This results in more nonuniformity in the compression of the material over large areas because the wires not aligned with respect to each other retard resilience. The resilience of this material cannot be controlled because of the lack of control over bent wire alignment, and therefore, the compression of the elastomeric material will be nonuniform over large areas.

OBJECTS

It is the object of this invention to provide improved high density interconnections between electronic circuits.

It is a further object of this invention to provide improved high density interconnections between electronic circuits which maintain the reliability of the electronic circuits when the circuits are connected over extended periods of time.

It is still a further object of this invention to provide an improved elastomeric material for connecting electronic circuits.

It is still a further object of this invention to provide an improved elastomeric material which minimizes compression differentials across the material.

It is still a further object of this invention to provide an improved elastomeric material which minimizes damage to electronic circuits when under compression for extended periods of time.

BRIEF DESCRIPTION OF THE DRAWING

FIG. 7 illustrates the enhanced wiping action of the second embodiment of the present invention.

SUMMARY OF THE INVENTION

This invention provides an interposer for electrically connecting two substrates with high density interconnections. The interposer comprises an elastomeric material surrounding fine metal wires which extend through the elastomeric material. The elastomeric material provides mechanical support and electrical isolation for the wires which connect the two opposing surfaces of the interposer with mating substrates. One surface of the interposer has scribes cut into it which mechanically isolate the individual wires. This mechanical isolation between wires reduces the differential stress placed on the substrates which results from compressing the interposer between the substrates. The support given individual wires by the elastomeric material is controlled, by adjusting the spacing and widths of the scribes, to provide uniform compression across the substrates. Reducing the differential stress (more compressive force in one area of the interposer than in another on the same circuit) across the substrates reduces the nonuniformity in the electrical connections, and therefore, maintains substrate reliability when the substrates are exposed to extended time periods under compression.

DESCRIPTION OF THE PREFERRED EMBODIMENT

Figure 1:
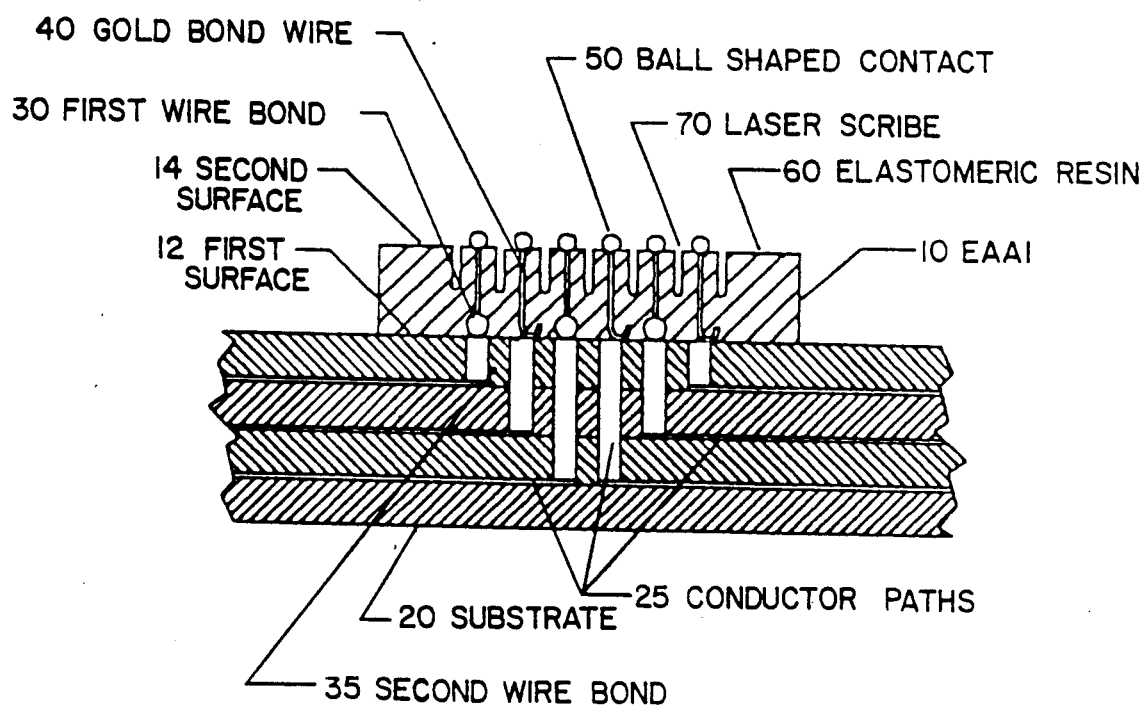
FIG. 1 illustrates a first embodiment of an elastomeric area array interposer according to the present invention.

A first preferred embodiment of the present invention is shown in FIG. 1. The elastomeric array area interposer (EAAI) 10 is a device for electrically connecting two substrates which is manufactured on a substrate 20 that further includes conductive paths 25. The EAAI 10 includes a first wire bond 30, a second wire bond 35, a metal wire 40, a ball shaped contact 50, elastomeric resin material 60, and laser scribes 70 within the elastomeric material. The wire bonds 30 and 35 are connected to the ball shaped contacts 50 by the metal wires 40. The elastomeric resin 60 surrounds, and is in intimate contact with, the metal wires 40. Additionally, laser scribes 70, within the elastomeric material 60, are advantageously placed between and around adjacent metal wires 40.

Figure 2:
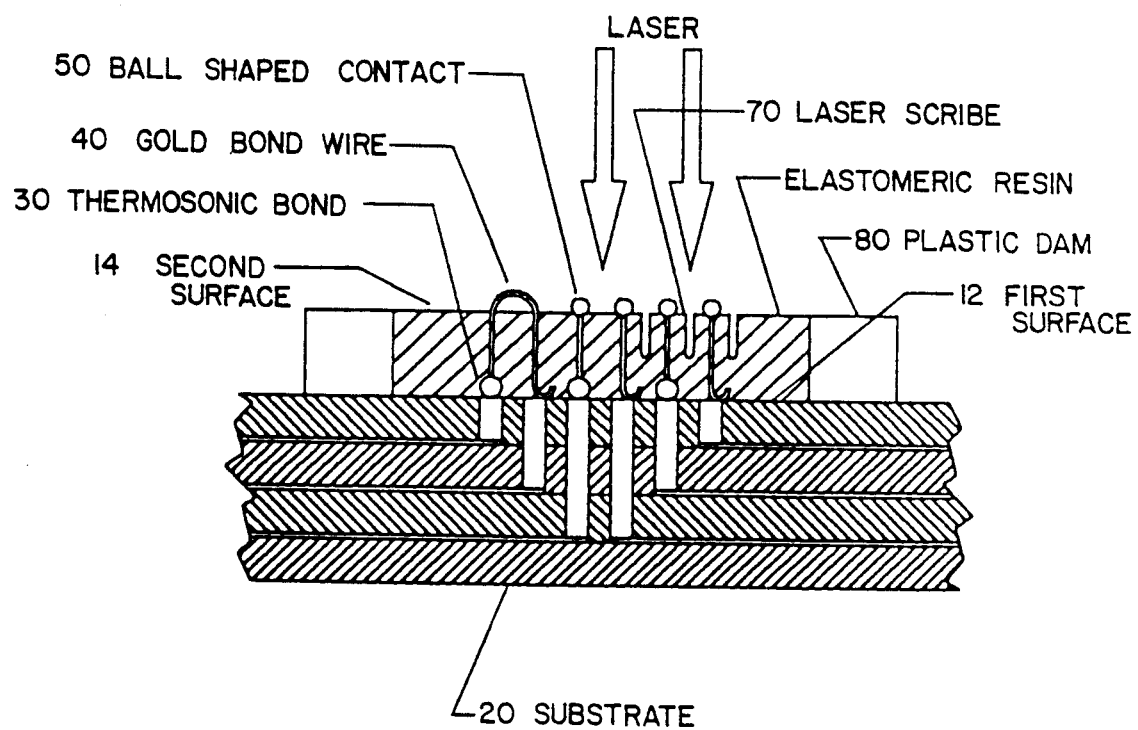
FIG. 2 illustrates a method of making an elastomeric area array interposer according to the present invention.

The process of manufacturing the EAAI 10 is illustrated by FIG. 2. The substrate 20 can be made from a variety of ceramic or resin compounds with conductive paths which are typically aluminum, molybdenum, or copper alloys. The design and manufacture of the substrate is well known in the prior art. The substrate typically has a pattern of terminal connection pads 23 (not shown) at the end of the conductive paths. These pads are generally of the same material as the conductive paths and are to be connected to a mating set of pads on a second substrate (see FIG. 3). A first wire bond 30 is attached to a terminal connection pad 23. The wire bond may be fabricated by a variety of processes. A typical process is thermosonic wire bonding in which heat, pressure, and ultrasonic (greater than 20,000 cycles/second) vibrations are applied to one end of a soft metal wire, compressing the wire onto the terminal connection pad 23. The heat, pressure, and vibrations bond the two metal surfaces together. Such a bonding process is well known in the prior art.

In FIG. 2, a gold wire is thermosonically bonded to a gold plated terminal connection pad 23. Gold is a metal with very good electrical characteristics and sufficient malleability that it is a good wire material as well. The terminal connection pads 23 have been plated with gold, via an electrodeposition process or the like, because the thermosonic bonding process gives superior mechanical and electrical connections with two gold surfaces as compared to the bonding process results with two different types of metal surfaces such as gold and aluminum. The bonding process for the second end of the wire 40 is a modified thermosonic wire bonding process and involves heat, pressure, and ultrasonic vibrations as used in bonding the first end. However, the tool which deposits the wire, called a feeder, also cuts the wire 40 to form the second end of the wire. This cutting is performed by squeezing or wedging the wire 40 between the substrate pad 23 and the feeder tool during the bonding process. The cutting process along with the bonding process forms a second wire bond 35 which does not generally have the same mechanical structure as the first wire bond 30. The metal wire 40, between the first and second wire bonds 30 and 35 is made long enough so that it forms an arch type or loop structure. That is, the gold wire extends in an approximate vertical fashion back to the surface of the substrate 20 after rising from the surface of the substrate 20 in an approximately vertical fashion. The height of the vertical extensions of the metal wire can be adjusted to obtain the desired thickness of the EAAI 10 as more fully disclosed below. The second end of the wire is bonded to an adjacent terminal connection pad 23 within the pattern of connection pads to minimize the deformation of the wires 40 during handling and application of the elastomeric material between the wires. The wire bonding and looping process is repeated until each terminal connection pad 23 has a wire bond attached to it.

After the gold wires 40 are bonded to the substrate 20, a dam 80 is placed on the substrate and surrounding the wire arches. The dam 80 can be made from a variety of materials such as plastic or metal as long as it is stable when subjected to the heat associated with the liquid phase of an elastomer resin. The dam 80 is of a height which is at least the thickness of the EAAI 10, and less than the height of the maximum extension of the wire arches. Once the dam 80 is in place, liquid elastomer resin material is applied to the surface of the substrate 20 inside the dam 80. The resin material initially has a viscosity which enables it to flow between and around the bonded wires 40. The dam 80 surrounding the wires 40 defines the outer edge to which the resin material is able to flow. The liquid resin material levels off at or below the height of the dam 80 and the wire arches extend up above the level of the liquid resin material. The liquid resin is then cured to form an elastomeric material 60 with resilient characteristics. The first and second wire bonds 30 and 35 of the metal wires 40 are embedded in a first surface 12 of the elastomeric material so that the bonds 30 and 35 continue to make contact with the substrate 20 and so that the metal wires 40 are electrically isolated from each other.

Figure 4:
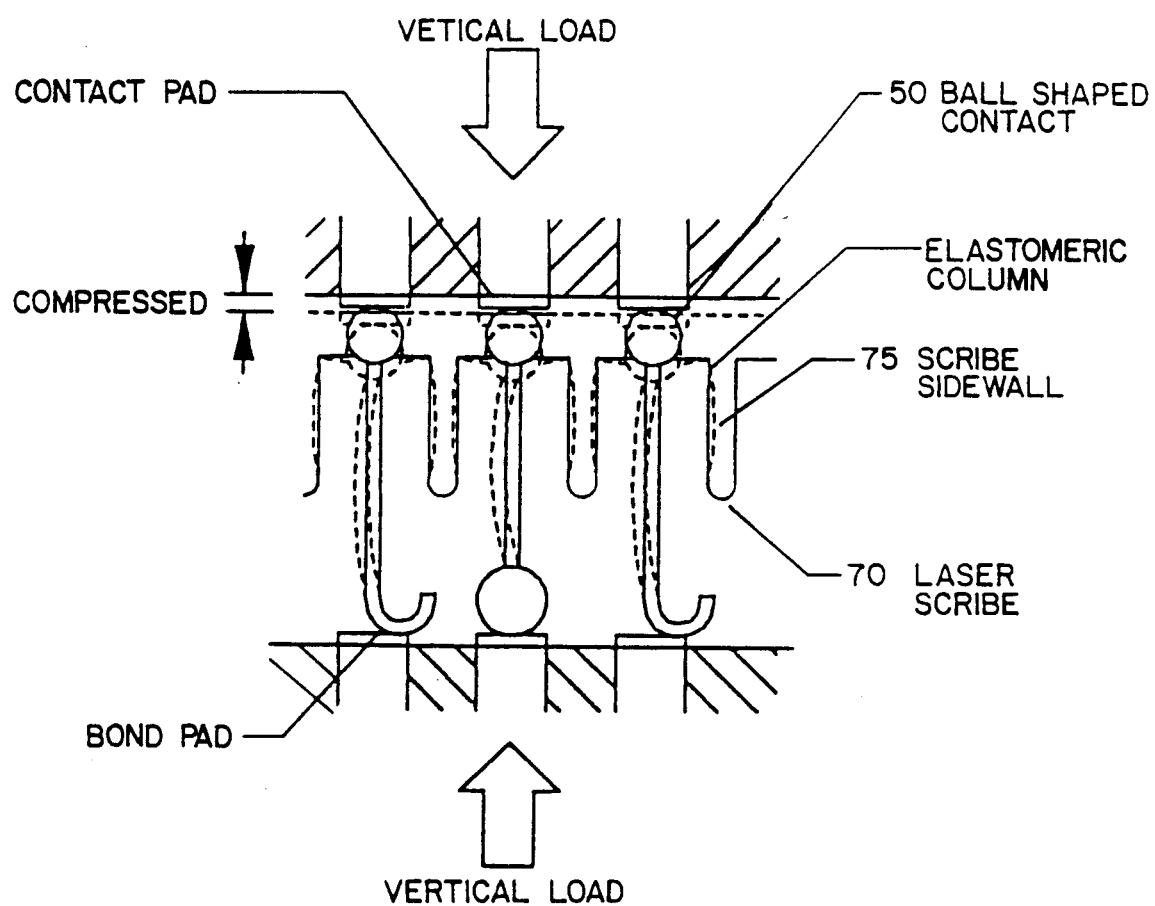
FIG. 4 illustrates a first embodiment of an elastomeric area array interposer when compressed between two substrates.

Once the elastomeric material 60 has been cured, the dam is removed leaving a defined pattern of elastomeric material 60 surrounding the plurality of wires 40 connected to a substrate. The elastomeric material provides mechanical support for the wires 40 which it surrounds. The wires joining adjacent terminal connection pads are now severed by cutting through the arch extending over the top of the elastomeric material 60. This cutting process is accomplished by a low power laser which also melts the exposed wire above each terminal connection pad. This melting forms the exposed wire into a ball shaped contact which rests on a second surface 14 of the elastomeric material 60 above each terminal connection pad. After the ball shaped contacts are formed, slots are cut into the elastomeric material 60 by a low power laser. This slot cutting is also called laser scribing and the scribes 70 or slots are cut around and interposed between the wires 40 and in other advantageous places in the elastomeric material 60 where it is desirable to adjust the resilience of the elastomeric material 60. The scribes have sidewalls 75, as shown in FIG. 4, which are typically vertical with respect to the surface of the substrate 20. The sidewalls 75 can also be tapered with respect to the metal wires 40. This taper provides more elastomeric material near the first and second bond end of the metal wire 40 and less material near the ball shaped contact of the metal wire 40. The tapered sidewalls provide more mechanical support of the metal wires 40 than the vertical sidewalls if such support is desired. The scribes 70 substantially enable individual wires to be compressed without affecting other wires. Since the elastomeric material 60 mechanically links the wires 40, reducing that linkage through the scribes reduces interwire effects. Also, the support given any single wire is adjusted by merely adjusting the width of the scribe which reduces the amount of material supporting the wire. It is not necessary to degrade the support provided to the wires 40 by the elastomeric material 60 because the width of the scribe can be minimal to separate the wires 40 and still have substantially the same amount of elastomeric material supporting each individual wire.

Figure 3:
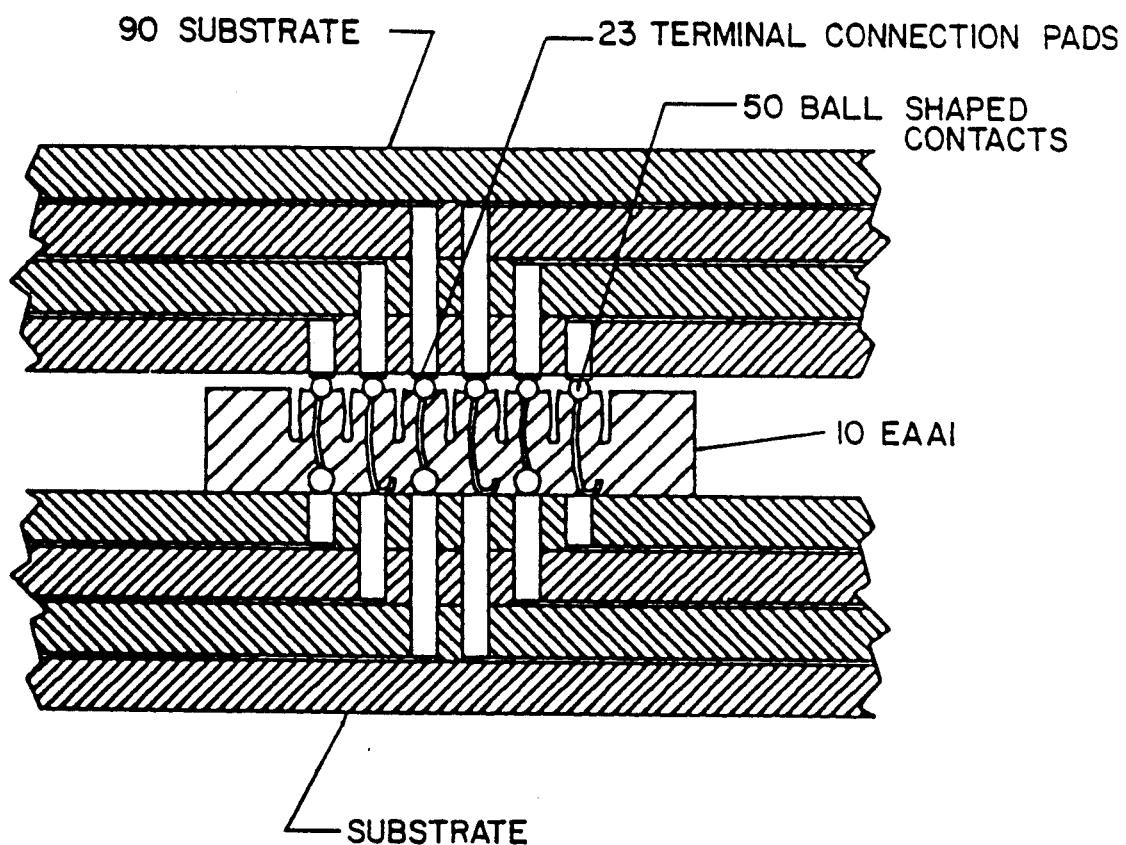
FIG. 3 illustrates a first embodiment of an elastomeric area array interposer connecting two substrates.

The EAAI 10 is now used to connect the first substrate 20 to a second substrate 90, as shown in FIG. 3. The second substrate has a pattern of terminal connection pads 23 which correspond to the pattern of terminal connection pads 23 on the first substrate 20. The corresponding patterns are aligned and the second substrate 90 is brought into contact with the ball shaped contacts 50 of the EAAI 10 with sufficient force to compress the EAAI 10. The compression provides adequate contact between the ball shaped contacts 50 and the terminal connection pads of the second substrate 90. The elastomeric material of the EAAI 10 horizontally expands, into the scribes 70, as it is vertically compressed. A more detailed view of the EAAI 10 under compression is shown in FIG. 4. The laser scribes 70 enable each metal wire 40 to compress independently from the adjacent metal wires. This independent movement means that a high density pattern of terminal connections in one area of the substrate, compared to another area of the substrate, will not produce a severe stress differential between the areas of the substrate. Even where some differential does exist, additional or wider laser scribes 70 can be used to reduce that stress differential in the affected areas of the EAAI 10.

The second substrate 90 is adequately connected to the first substrate 20 only when the EAAI 10 is compressed. The resilient characteristics of the elastomer material 60 vertically expands the EAAI 10 when the second substrate 90 is moved away from the metal ball contacts 50. Therefore, the connection and reconnection operations can be performed repeatedly and uniformly while maintaining reliable contact each time the connection is made and simultaneously avoiding stress or damage to the second substrate 90.

Figure 5:
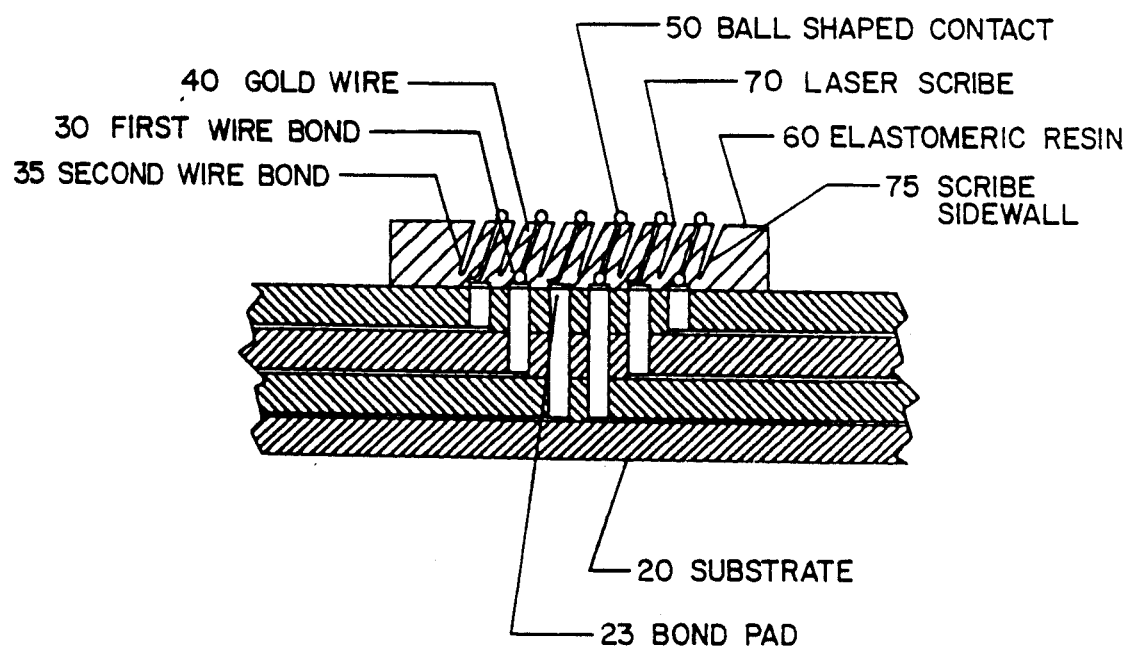
FIG. 5 illustrates a second embodiment of an elastomeric area array interposer according to the present invention.
Figure 6:
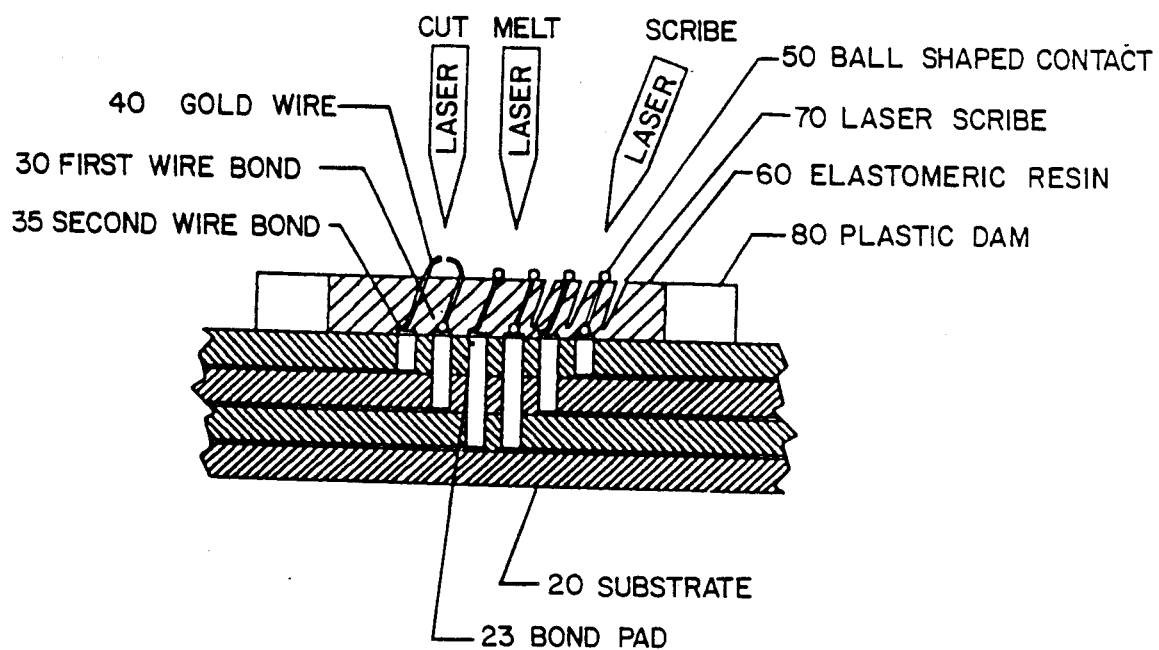
FIG. 6 illustrates the laser scribe orientation used to scribe the second embodiment of the present invention.
Figure 8A:
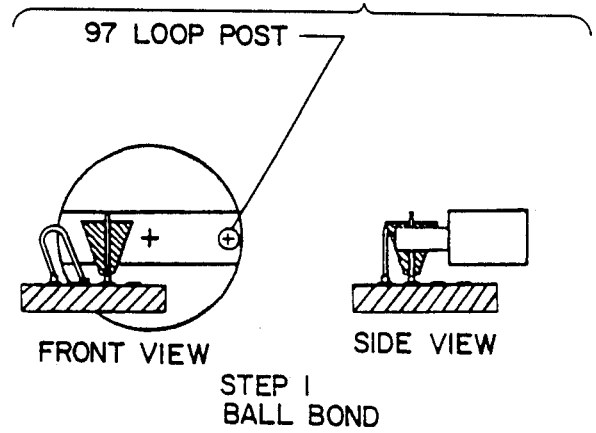
FIG. 8 illustrates the bonding technique used to set the angle of the wires in the second embodiment of the present invention.
Figure 8B:
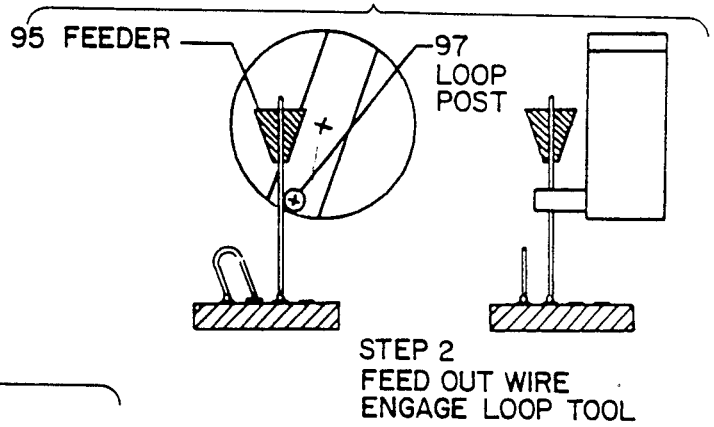
Figure 8C:
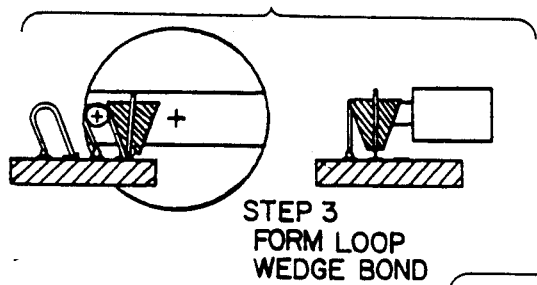
Figure 8D:
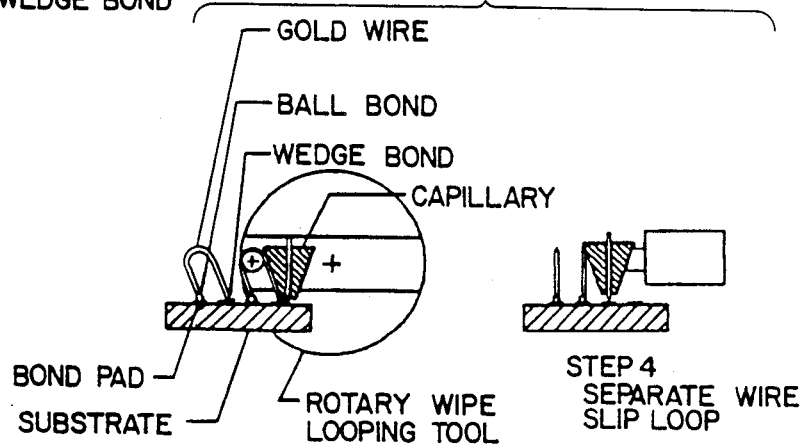

A second embodiment of the invention is shown in FIG. 5. In this embodiment, the metal wires 40 are bonded to the terminal connection pads 23 of a substrate 20, and extend through the elastomeric material 60 as in the first embodiment. However, in this embodiment, the wires 40 are formed at an angle with respect to the substrate 23. The use of the wire feeder tool as a cutting mechanism for the second end of the wire 40 facilitates shaping the wire loop, which is formed before the elastomeric resin is applied, at an angle with respect to the substrate 20. The bonding technique shapes the loop attached to the wedge bond 35 such that the metal wires 40 within the elastomeric material 60, are parallel with respect to each other and are also substantially nonvertical with respect to the substrate 20. The angle or slant which the metal wires 40 form with respect to the substrate is variable depending on the compression required for connecting the substrates, but is generally in the range of 45 to 85 degrees. FIG. 8 particularly illustrates the loop forming process. The edge of the wire feeder 95 wedges one end of the wire against the substrate terminal connection pad 23 while tension on the wire from the shape of the feeder edge forms the wire at a set angle around a loop post 97 of the bond tool. This set angle then becomes the same angle for all the wires because they all are formed with the same tool edge. Once the loop has been formed with this slant, the resin material is applied and cured. A laser then cuts and melts the wires as in the first embodiment. A laser then scribes the elastomeric resin material such that the sidewalls of the scribe 75 are substantially parallel with the metal wires. FIG. 6 illustrates how the scribe laser must be oriented with respect to the cut and melt orientations. The scribe laser is at a distinct angle with respect to the cut and melt lasers. The scribing forms an elastomeric support for each metal wire which is slanted at approximately the same angle as the wire.

This embodiment of the invention has the particular advantage of enhanced contact wiping. When wires are substantially vertical, as in the first embodiment of the present invention, and a substrate is vertically compressed against them, the lateral movement of the ball contacts will be approximately random. Therefore, many of the ball shaped contacts 50 will not scrape laterally against the substrate terminal connection pads 23, and so will not make good electrical contact through insulating residues and oxides left on the substrate terminal contacts from prior storage or processing. In this embodiment, the slanted wires and elastomeric supports, bias the movement of the ball shaped contacts 50 against the substrate terminal connection pads 23. When the substrate 90 compresses the slanted wires they will all move a distance laterally in the direction of the slant, as shown in FIG. 7. The lateral distance will depend on the angle of the wires and compression which can be adjusted to fit varying process or test requirements. FIG. 7 illustrates that this distance is expected to be approximately 0.002 inches for the second embodiment of this invention. Since the ball contacts 50 are moving a lateral distance while in contact with the substrate terminal connection pads 23, they will mechanically scrape through any residue film or oxidation which typically impedes electrical contact in conventional interconnect devices. Therefore, this embodiment will assure more reliable electrical contact between two substrates.

While this invention has been particularly described and illustrated with reference to a preferred embodiment thereof, it will be understood by those skilled in the art that changes in the above description or illustration may be made with respect to form or detail without departing from the spirit and scope of the invention.

We claim:

1. An elastomeric electrical connector comprising:
    a plurality of metal wires extending through elastomeric material, said elastomeric material having first and second opposing surfaces, each of said plurality of metal wires being attached to a substrate terminal contact on a first end and, having a ball shaped contact on a second end, said plurality of metal wires being supported by said elastomeric material on a first substrate;
    said first end being attached to said substrate terminal contact by a metal bond, said metal bond connecting said first substrate to said elastomeric electrical connector and being substantially embedded in said first surface of said elastomeric material; said ball shaped contact extending from said second surface of said elastomeric material and connecting a second substrate having terminal contacts to said elastomeric electrical connector when said first substrate and a second substrate compress said elastomeric material between said first and second substrates; and
    a plurality of scribes extending substantially into said second surface of said elastomeric material, said scribes being interposed between and separated from said plurality of metal wires to enable each of said plurality of metal wires to substantially compress independently from adjacent metal wires.

2. An elastomeric electrical connector as in claim 1 wherein: said scribes have substantially vertical sidewalls with respect to said surfaces of said first and second substrates.

3. An elastomeric electrical connector as in claim 1 wherein:
    separation between said sidewalls of said scribes adjusts said support of said metal wires from said elastomeric material.

4. An elastomeric electrical connector as in claim 1 wherein:
    said sidewalls of said scribes are tapered with respect to said metal wires, said taper providing increased support of said metal wires near said second end of said metal wire with respect to said first end of said metal wire.

5. An elastomeric electrical connector as in claim 1 wherein:
    said metal wires extend through said elastomeric material vertically with respect to said surfaces of said first and second substrates.

6. An elastomeric electrical connector as in claim 1 wherein:
    said sidewalls of said scribes are at an angle with respect to said surfaces of said first and second substrates and said metal wires extending through said elastomeric material at substantially said angle with respect to said surfaces of said first and second substrates.

7. An elastomeric electrical connector as in claim 1 wherein:
    said compression of said elastomeric material between said first and second substrates provides wiping action between said ball shaped contact and said second substrate's terminal contact, said wiping action providing enhanced electrical contact between the ball shaped contact and said second substrate's terminal contact.

8. An elastomeric electrical connector as in claim 6 wherein:
    said compression of said elastomeric material between said first and second substrates providing wiping action between said ball shaped contact and said second substrate's terminal contact, said wiping action providing enhanced electrical contact between said ball shaped contact and said second substrate's terminal contact.

* * * * *